US011578173B2

(12) United States Patent
Terfort et al.

(10) Patent No.: US 11,578,173 B2
(45) Date of Patent: Feb. 14, 2023

(54) METHOD FOR PREPARING A CROSS-LINKED HYDROGEL NANOMEMBRANE, THE CROSS-LINKED HYDROGEL NANOMEMBRANE, TEM GRID COMPRISING THE SAME AND USE THEREOF

(71) Applicants: Quantifoil Micro Tools GmbH, Großlöbichau/Jena (DE); Max-Planck-Gesellschaft zur Förderung der, Munich (DE)

(72) Inventors: Andreas Terfort, Halstenbek (DE); Daniel Rhinow, Munich (DE); Julian Scherr, Ober-Ursel (DE)

(73) Assignees: Quantifoil Micro Tools GmbH, Jena (DE); Max-Planck-Gesellschaft zur Förderung der, Munich (DE)

( * ) Notice: Subject to any disclaimer, the term of this patent is extended or adjusted under 35 U.S.C. 154(b) by 650 days.

(21) Appl. No.: 16/635,592

(22) PCT Filed: May 4, 2018

(86) PCT No.: PCT/EP2018/061475
§ 371 (c)(1),
(2) Date: Jan. 31, 2020

(87) PCT Pub. No.: WO2018/202837
PCT Pub. Date: Nov. 8, 2018

(65) Prior Publication Data
US 2020/0239642 A1 Jul. 30, 2020

(30) Foreign Application Priority Data
May 4, 2017 (EP) .................................... 17169372

(51) Int. Cl.
*G01F 23/00* (2022.01)
*G01J 1/00* (2006.01)
*G01J 5/00* (2022.01)
*C08G 61/04* (2006.01)
*C08G 83/00* (2006.01)
*C08J 3/075* (2006.01)
*C08J 3/28* (2006.01)
*C08K 5/1515* (2006.01)
*B82Y 30/00* (2011.01)
*H01J 37/20* (2006.01)

(52) U.S. Cl.
CPC .......... *C08G 83/003* (2013.01); *C08J 3/075* (2013.01); *C08J 3/28* (2013.01); *C08K 5/1515* (2013.01); *B82Y 30/00* (2013.01); *H01J 37/20* (2013.01)

(58) Field of Classification Search
CPC ... C08K 5/1515; C08G 83/0003; H01J 37/26; H01J 37/20; C08J 3/075; C08J 3/28; B82Y 30/00

USPC ................ 250/440, 338.1, 336.1; 520/1
See application file for complete search history.

(56) References Cited

U.S. PATENT DOCUMENTS

2007/0286883 A1  12/2007  Lensen et al.
2018/0017558 A1   1/2018  Terfort et al.

FOREIGN PATENT DOCUMENTS

WO  WO-2017189977 A1 * 11/2017 ............. B01D 61/38

OTHER PUBLICATIONS

Meyerbroker et al., Ultraflexible, Freestanding Nanomembranes Based on POly(ethylene glycol), 2014, Adv. Mater, 26, 3328-3332 (Year: 2014).*
PCT/EP2018/061475; PCT International Search Report and Written Opinion of the International Searching Authority dated Jul. 5, 2018.
PCT/EP2018/061475; PCT International Preliminary Report on Patentability dated Nov. 5, 2019.
Allegretti et al.; "Horizontal membrane-intrinsic a-helices in the stator a-subunit of an F-type ATP synthase"; vol. 521, Nature, May 14, 2015.
Brilot et al.; "Beam-induced motion of vitrified specimen on holey carbon film"; Journal of Structural Biology, vol. 177, Issue 3, Mar. 2012, pp. 630-637.
Campbell et al.; "Movies of Ice-Embedded Particles Enhance Resolution in Electron Cryo-Microscopy"; Structure 20, pp. 1823-1828, Nov. 7, 2012.
Chen et al.; "High-resolution noise substitution to measure over-filling and validate resolution in 3D structure fetermination by single particle electron cryomicroscopy"; Ultramicroscopy 135 (2013) pp. 24-35.
Cheung et al.; "A method to achieve homogeneous dispersion of large transmembrane complexes within the holes of carbon films for electron cryomicroscopy"; Journal of Structural Biology 182 (2013) pp. 51-56.
D'Imprima et al.; "Cryo-EM structure of respiratory complex I reveals a link to mitochondrial sulfur metabolism"; Biochimica et Biophysica Acta 1857 (2016) pp. 1935-1942.
Hirst; "Mitochondrial Complex I"; Annu. Rev. Biochem. 2013.82: pp. 551-575.
Ying et al.; "Self-Assembled Monothiol-Terminated Hyperbranched Polyglycerols on a Gold Surface: A Comparative Study on the Structure, Morphology, and Protein Adsorption Characteristics with Linear Poly(ethylene glycol)s"; Langmuir 2008, 24, pp. 4907-4916.
Noushin Kashani-Poor; "Efficient large scale purification of his-tagged proton translocating NADH:ubiquinone oxidoreductase (complex I) from the strictly aerobic yeast *Yarrowia lipolytica*"; Biochimica et Biophysica Acta 1504 (2001) pp. 363-370.

(Continued)

Primary Examiner — Jessica Whiteley
(74) Attorney, Agent, or Firm — Renner, Otto, Boisselle & Sklar, LLP

(57) ABSTRACT

The present invention relates to a method for preparing a hydrogel nanomembrane comprising: a) formation of a non-cross-linked hydrogel nanofilm on a first substrate; b) cross-linking the non-cross-linked hydrogel with a cross-linking agent to obtain a cross-linked hydrogen nanomembrane; and c) transferring the cross-linked hydrogel nanomembrane to a second substrate, a respective cross-linked hydrogel nanomembrane, a TEM grid comprising the same and use thereof.

17 Claims, 11 Drawing Sheets

(56) References Cited

OTHER PUBLICATIONS

Figure 1:
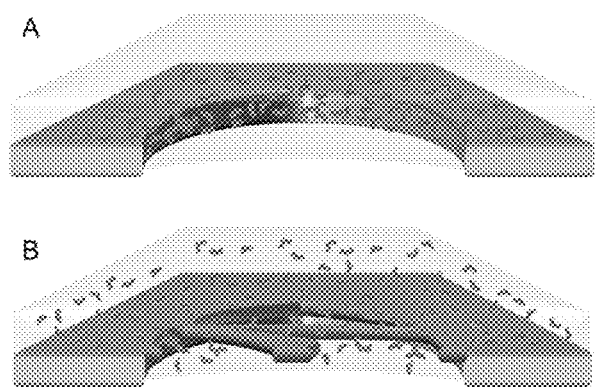

Khan et al.; "Hyperbranched Polyglycidol on Si/SiO2 Surfaces via Surface-Initiated Polymerization"; Macromolecules 2003, 36, pp. 5088-5093.
Kucukelbir et al.; "Quantifying the local resolution of cryo-EM density maps"; Nature Methods, vol. 11, No. 1, Jan. 2014, pp. 63-67.
Kuhlbrandt; "The Resolution Revolution"; Science vol. 343, Mar. 28, 2014, pp. 1443-1445.
Li et al; "Electron counting and beam-induced motion correction enable near-atomic-resolution single-particle cryo-EM"; Nature Methods, vol. 10 No. 6, Jun. 2013, pp. 584-593.
Ludtke et al.; "EMAN: Semiautomated Software for High-Resolution Single-Particle Reconstructions"; Journal of Structural Biology 128, pp. 82-97 (1999).
McMullan et al; "Detective quantum efficiency of electron area detectors in electron microscopy"; Ultramicroscopy 109 (2009) pp. 1126-1143.
Meyerson et al.; "Self-assembled monolayers improve protein distribution on holey carbon cryo-EM supports"; Scientific Reports; 4: 7084, (2014) pp. 1-5.
Milazzo et al.; "Initial evaluation of a direct detection device detector for single particle cryo-electron microscopy"; Journal of Structural Biology, vol. 176, Issue 3, Dec. 2011, pp. 404-408.
Mindell et al.; "Accurate determination of local defocus and specimen tilt in electron microscopy"; Journal of Structural Biology, vol. 142, Issue 3, Jun. 2003, pp. 334-347.
Pantelic et al.; "Graphene oxide: A substrate for optimizing preparations of frozen-hydrated samples"; Journal of Structural Biology, vol. 170, Issue 1, Apr. 2010, pp. 152-156.
Pantelic et al.; "Graphene: Substrate preparation and introduction"; Journal of Structural Biology, vol. 174, Issue 1, Apr. 2011, pp. 234-238.
Perepichka et al.; "Hydrophilic Oligo(oxyethylene)-Derivatized Poly(3,4-ethylenedioxythiophenes): Cation-Responsive Optoelectroelectrochemical Properties and Solid-State Chromism"; Chem Mater. 2002, 14, pp. 449-457.
Pettersen et al.; "UCSF Chimera—A Visualization System for Exploratory Research and Analysis"; vol. 25, No. 13, Journal of Computational Chemistry, pp. 1605-1612.
Rhinow et al.; "Ultrathin Conductive Carbon nanomembranes as support films for structural analysis of biological specimens", Phys. Chem. Chem. Phys.; 2010, 12, pp. 4345-4350.
Rhinow et al.; "Electron cryo-microscopy of biological specimens on conductive titanium-silicon metal glass films"; Ultramicroscopy vol. 108, Issue 7, Jun. 2008, pp. 698-705.
Russo et al.; "Controlling protein adsorption on graphene for cryo-EM using low-energy hydrogen plasmas"; Nature Methods, vol. 11 No. 6, Jun. 2014, pp. 649-657.
Russo et al.; "Ultrastable gold substrates for electron cryomicroscopy"; Dec. 12, 2014, vol. 346, Issue 6215, pp. 1377-1381.
Scheres; "RELION: Implementation of a Bayesian approach to cryo-EM structure determination"; Journal of Structural Biology 180 (2012) pp. 519-530.
Schres; "Prevention of overfitting in cryo-EM structure determination"; Nature Methods, vol. 9 No. 9, Sep. 2012, pp. 853-854.
Siegers; "Self-Assembled Monolayers of Dendritic Polyglycerol Derivatives on Gold That Resist the Adsorption of Proteins"; Chem. Eur. J. 2004, 10, pp. 2831-2838.
Suloway et al.; "Automated molecular microscopy: The new Leginon system"; Journal of Structural Biology, vol. 151, Issue 1, Jul. 2005, pp. 41-60.
Van Lis et al.; "New Insights into the Unique Structure of the F0F1-ATP Synthase from the *Chlamydomonad* Algae *Polytomella* sp. and Chlamydomonas reinhardtii"; Plant Physiology, Jun. 2007, vol. 144, pp. 1190-1199.
Weber et al.; "Direct grafting of anti-fouling polyglycerol layers to steel and other technically relevant materials"; Colloiods and Surfaces B: Biointerfaces, vol. 111, Nov. 1, 2013, pp. 360-366.
Wyszogrodzka et al.; "Synthesis and Characterization of Glycerol Dendrons, Self-Assembled Monolayers on Gold: A Detailed Study of Their Protein Resistance"; Biomacromolecules, vol. 10, No. 5, 2009, pp. 1043-1054.
Zheng et al.; "MotionCor2—anisotropic correction of beam-induced motion for improved cryo-electron microscopy"; Nat Methods. Apr. 2017; 14(4): 331-332, pp. 1-4.
Meyerbroker et al.; "Ultraflexible, Freestanding Nanomembranes Based on Poly(ethylene glycol)"; Adv. Mater. 2014, 26, pp. 3328-3332.
Meyerbroker et al.; "Modification and Patterning of Nanometer-Thin Poly(ethylene glycol) Films by Electron Irradiation"; ACS Appl. Mater. Interfaces 2013, 5, pp. 5129-5138.
Khan et al.; "Chemical derivatization and biofunctionalization of hydrogel nanomembranes for potential biomedical and biosensor applicationst"; Phys Chem. Chem. Phys., 2016. 18. pp. 12035-12042.
Biswas et al.; "Cross-linked nanofilms for tunable permeability control in a composite microdomain system"; RSC Adv., 2016, 6, pp. 71781-71790.
Rohou et al.; "CTFFIND4: Fast and accurate defocus estimation from electron micrographs"; Journal of Structural Biology, vol. 192, Issue 2, Nov. 2015, pp. 216-221.

\* cited by examiner

METHOD FOR PREPARING A CROSS-LINKED HYDROGEL NANOMEMBRANE, THE CROSS-LINKED HYDROGEL NANOMEMBRANE, TEM GRID COMPRISING THE SAME AND USE THEREOF

The present application is a U.S. National Stage Application based on and claiming benefit and priority under 35 U.S.C. § 371 of International Application No. PCT/EP2018/061475, filed 4 May 2018, which in turn claims benefit of and priority to European Application No. 17169372.4 filed 4 May 2017, the entirety of both of which is hereby incorporated herein by reference.

The present invention relates to a method for preparing a cross-linked hydrogel nanomembrane, the respective cross-linked hydrogel nanomembrane, a TEM grid comprising the same and the use thereof.

PRIOR ART

Solving the structure of biological molecules is of critical importance for understanding cellular processes and subsequent development of pharmaceutical treatments. Three-dimensional electron cryo-microscopy (cryo-EM) is a powerful method to study the structure of vitrified biological macromolecules under near-native conditions. Recently, direct electron detectors have been developed, which enable data acquisition at unprecedented signal-to-noise ratio.[1,4]

Despite tremendous technological advances, the most critical factor that determines the success of cryo-EM remains the specimen itself. For structural analysis by cryo-EM, biomolecules are vitrified in a thin water film spanning the holes of a holey amorphous carbon film by plunging into liquid ethane. Alternatively, metallic glasses,[5] graphene,[6,7] graphene-like materials,[8,9] and gold[10] have been used as support films for cryo-EM of vitrified specimens.

Preparing vitrified specimens from detergent-solubilized membrane proteins is particularly challenging. To prevent membrane proteins from aggregating after isolation from the lipid bilayer, detergents are required to locally provide a hydrophobic environment for the membrane-embedded part of the protein. Detergents reduce the surface tension of an aqueous solution, and this frequently results in depletion of biomolecules from the thin water film spanning the holes of holey carbon supports. Sometimes, an additional thin layer of continuous carbon film is used to improve the number and distribution of particles. However, the extra mass of the carbon film reduces image contrast and can result in preferential orientation of proteins on the film, which is undesirable for structure determination. Generally, depletion of membrane proteins from the water film onto the substrate material during specimen preparation remains a problem (FIG. 1A), which can only partly be solved by either using detergents (with carbon substrates)[11] or self-assembled monolayers (for Au).[12]

It is, therefore, the object of the present invention to provide novel substrates for cryo-electron microscopy overcoming drawbacks of the prior art. In particular, it is the object of the present invention to provide a support film that considerably improves specimen preparation for membrane proteins and meets the following requirements: 1) it stabilizes of the thin water film that contains detergent-solubilized proteins and spans the holes in a holey carbon film. 2) It interacts minimally with the proteins. 3) It can be deposited on diverse specimen support substrates.

PRESENT INVENTION

This object is, first of all, achieved by a method for preparing a hydrogel nanomembrane comprising: a) formation of a non-cross-linked hydrogel nanofilm on a first substrate; b) cross-linking the non-cross-linked hydrogel with a cross-linking agent to obtain a cross-linked hydrogel nanomembrane; and c) transferring the cross-linked hydrogel nanomembrane to a second substrate.

Under appropriate conditions, the nanomembranes tear up upon transfer to the second substrate. Surprisingly, the inventors have found that self-perforating hydrogel nanomembranes (SPHyNs) are suitable for stabilizing a thin water film in Cryo-EM, which improves the distribution of proteins in the ice considerably. The inventors used SPHyNs to acquire high-resolution single-particle cryo-EM data of two large membrane protein complexes of the inner mitochondrial membrane with high efficiency. The new support films enable to calculate an improved 3D reconstruction of biomolecules, such as *Polytomella* ATP synthase from significantly fewer particles compared to the prior art.

More generally, the inventive nanomembranes facilitate collecting of data by improving the distribution of vitrified biomolecules in the holes of a TEM grid.

In this regard, the membranes feature the following advantages.

1. Stabilizing a thin film of water in the holes of a cryo-transmission microscopy grid (cryo-TEM grid).
2. The membrane is biorepulsive and minimizes unspecific adsorption of the biomolecules on the membrane.
3. Coverage of a film comprising holes with the biorepulsive membranes results in suppression of adsorption of biomolecules on the film.
4. A uniform distribution of biomolecules in the hole of a hole-containing film is achieved.
5. Both closed as well as self-perforating nanomembranes can be achieved. Self-perforating nanomembranes are such membranes which tear up during transfer from the first substrate to the second substrate. In this way, a net structure is achieved stabilizing thin films of water. In this holes of such a film interaction of an electron beam with the support is avoided and the contrast is optimized.
6. It is also possible to prepare closed nanomembranes having a thickness of only a few nanometers minimizing interaction with an electron beam. Such layers may be functionalized (for example using a His-Tag, biotin-Tag . . . ) allowing specific binding of marked biomolecules (for example proteins, viruses . . . ).

In general, it is possible to prepare hydrogel nanomembranes having specifically adjusted mechanical stabilities. The mechanical stability may be adjusted by selecting concentration and nature of the cross-linking agent.

Step (a)

In one embodiment, the non-cross-linked nanofilm comprises a biorepulsive hydrophilic dendrimer.

In a further embodiment, the biorepulsive hydrophilic dendrimer comprises polyglycerol or derivatives thereof.

Preferably, the derivatives comprise functionalized polyglycerol having an anchor group allowing binding of the functionalized polyglycerol to the first substrate.

More preferably, the anchor group is a sulfide group, a disulfide group or a mixture thereof and the first substrate comprises or consists of gold.

In a preferred embodiment, the non-cross-linked hydrogel nanofilm is a monolayer comprising polyglycerol derivatives, the first substrate is gold and the polyglycerol is bound to the first substrate via a S—(CH2)$_2$—NH spacer, wherein the S is bound to the first substrate and the NH group is bound to the polyglycerol.

More preferred, the thickness of the non-cross-linked hydrogel nanofilm is from 1 to 4 nm.

The thickness of the nanofilm can be controlled by appropriate choice of the size of the hydrogel molecules, the concentration thereof in the solution used for providing the same on the first substrate, deposition time, deposition temperature etc.

Step (b)

In one embodiment, the cross-linking agent is a bifunctional cross-linking agent and/or a polymerization cross-linking agent.

Preferably, the bifunctional cross-linking agent is a oligoethylene glycol derivative.

In a more preferred embodiment, the bifunctional cross-linking agent is a oligoethylene glycol derivative having respectively two leaving groups at the terminal ends thereof.

In a preferred embodiment, the oligoethylene glycol derivative is 1,11-dichloro-3,6,9-trioxaundecan, 1,11-dibromo-3,6,9-trioxaundecan, 1,11-diiodo-3,6,9-trioxaundecan, 1,11-di(tosyloxy)-3,6,9-trioxaundecan, 1,11-di(mesyloxy)-3,6,9-trioxaundecan or a mixture thereof.

Preferably, the polymerization cross-linking agent is a diglycidyl ether.

More preferably, the polymerization cross-linking agent is a diglycidyl ether based on ethylene glycol.

Most preferred, the concentration of the cross-linking agent is from 20 mM to 100 mM.

In principle, bifunctional cross-linking agents will favor the formation of self-perforating nanomembranes while closed nanomembranes may rather be achieved using a polymerization cross-linking agent.

Furthermore, stability of the nanomembranes may be adjusted by the concentration of the cross-linking agent.

Step (c)

In one embodiment, the second substrate has holes.

It is preferred that the holes have a size from 50 nm to 500 μm.

In a preferred embodiment, the second substrate is a TEM grid.

In a more preferred embodiment, the second substrate comprises or consists of silicon, carbon, SiO$_2$, Au or a composite thereof.

Preferably, the step (c) of transferring the cross-linked hydrogel nanomembrane to the second substrate comprises at least one, preferably all of the following sub-steps:

i) coating the cross-linked hydrogel nanomembrane with a polymer layer;
ii) contacting the obtained polymer coated cross-linked hydrogel nanofilm on the first substrate with water;
iii) contacting the resultant product with an iodine-containing solution, preferably comprising 2 to 3 wt % iodine;
iv) contacting the resultant product with a potassium iodide-containing solution, preferably comprising 5 to 15 wt % potassium iodide;
v) contacting the resultant product with an organic solvent;
vi) drying.

More preferred, the polymer is poly(methylmethacrylate).

In a preferred embodiment, the organic solvent is acetone.

In a more preferred embodiment, drying is critical point drying. Using critical point drying results in mild drying conditions.

The object is further achieved by a cross-linked hydrogel nanomembrane obtainable by the inventive method.

Under appropriate conditions, the composition of the cross-linked hydrogel nanomembrane may be adjusted, so that it tears up upon transfer to the second substrate, forming openings within the nanomembrane.

In one embodiment, the holes in the nanomembrane may have a width of 50 to 500 nm as a result of the tearing process. The size of the holes in the nanomembrane may be adjusted by a consecutive plasma or glow-discharge treatment. Adjustment of the holes might be appropriate to improve the nanomembrane.

Thickness of the non-crosslinked hydrogel nanofilm and of the holes in the nanomembrane may be done by SEM analysis.

The object is further achieved by a TEM grid comprising the cross-linked hydrogel nanomembrane and the second substrate, wherein the cross-linked hydrogel nanomembrane is disposed on at least one surface of the second substrate.

Finally, the object is achieved by the use of the inventive TEM grid in high resolution cryo-electron microscopy.

Preferably, the use encompasses analysis of vitrified biological macromolecules.

According to the invention is also the use of a hydrogel nanomembrane for stabilizing a thin water film in cryo-microscopy or the use of a hydrogel nanomembrane for improving the distribution of proteins in ice. In one embodiment, the hydrogel nanomembrane may be a perforated or self-perforating nanomembrane.

The obtained hydrogel nanomembranes have a significantly lower thickness compared to membranes of the prior art. In this way, transparency for electron beams is improved. Furthermore, respective membranes of the prior art suffer from poor mechanical stability.

In the following, the invention will be described in greater detail referring to specific embodiments and the enclosed figures, wherein FIG. 1 Distribution of membrane proteins on holey carbon films without and with SPHyNs. (A) Owing to a variety of effects, such as reduced surface tension and non-specific adsorption, proteins are frequently accumulated on or near the carbon film and thus depleted from the thin water layer in the holey carbon film by accumulation at and near the carbon film. (B) Biorepulsive SPHyNs stabilize the thin water layer as well as cover the carbon film thus preventing depletion of proteins from the holes and minimizing adsorption to the solid substrate.

Figure 2:
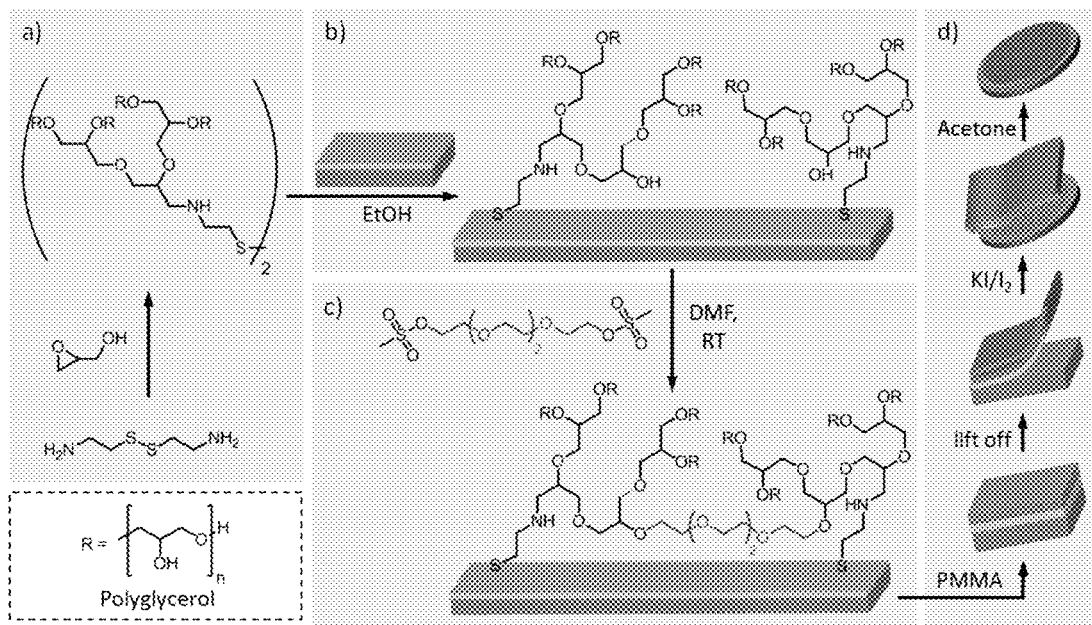

FIG. 2 Fabrication of SPHyNs and their transfer to TEM grids. (a) PG-functionalized disulfide was synthesized by a polymerization reaction of glycidol with cystamine as initiator and was subsequently attached to a gold surface (b). (c) To generate freestanding membranes, the PG dendrimers were crosslinked with 1,11-di(mesyloxy)-3,6,9-trioxaundecane (Ms2TEG), synthesized using tetraethylene glycol as starting material. (d) Transfer of the membrane (green layer) to a TEM grid: First, PMMA is spin-coated onto the gold substrate (blue layer). Second, the gold layer with the two polymer layers is released from the silicon wafer, followed by dissolution of the gold. Third, the sandwich consisting of PMMA and crosslinked PG is placed on a TEM grid. In the final step, PMMA is dissolved with acetone in a critical-point dryer.

Figure 3:
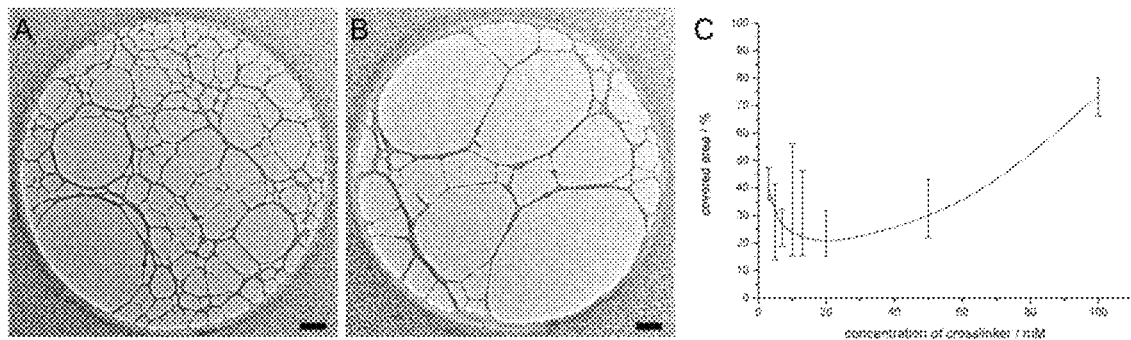

FIG. 3 TEM analysis of freestanding SPHyNs. (A), (B) TEM images of SPHyNs spanning holes of a Quantifoil®

R2/2 substrate. SPHyNs were fabricated at concentrations of 50 mM (A) or 10 mM (B) of Ms2TEG. Scale bars are 200 nm. (C) Dependence of porosity, measured as the average area covered by SPHyNs in the holes of a Quantifoil® R2/2 substrate, on crosslinker concentration. Averages were obtained from 30 independent TEM images for each concentration. The curve is intended as a guide.

Figure 4:
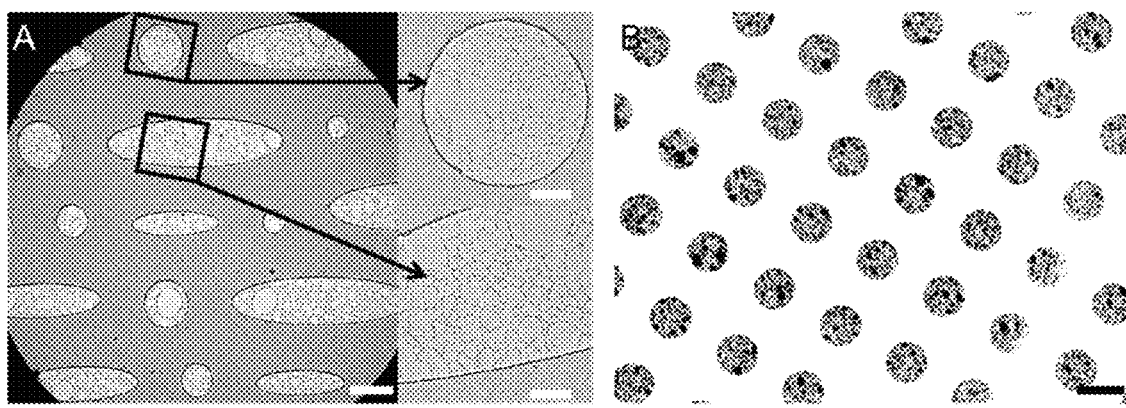

FIG. 4 SPHyNs imaged by SEM and TEM. The SPHyNs were obtained with 5 mM Ms2TEG. (A) TEM image of a SPHyN transferred to a C-flat® multi-hole substrate. The self-perforation of the film is independent of the shape and size of the holes in the substrate. (right) Magnified views of selected holes. Scale bars are 2 μm (left) and 500 nm (right). (B) Secondary electron SEM image of a SPHyN on a Quantifoil® R2/2 substrate. No pore formation is observed on the solid substrates. The scale bar is 2 μm.

Figure 5:
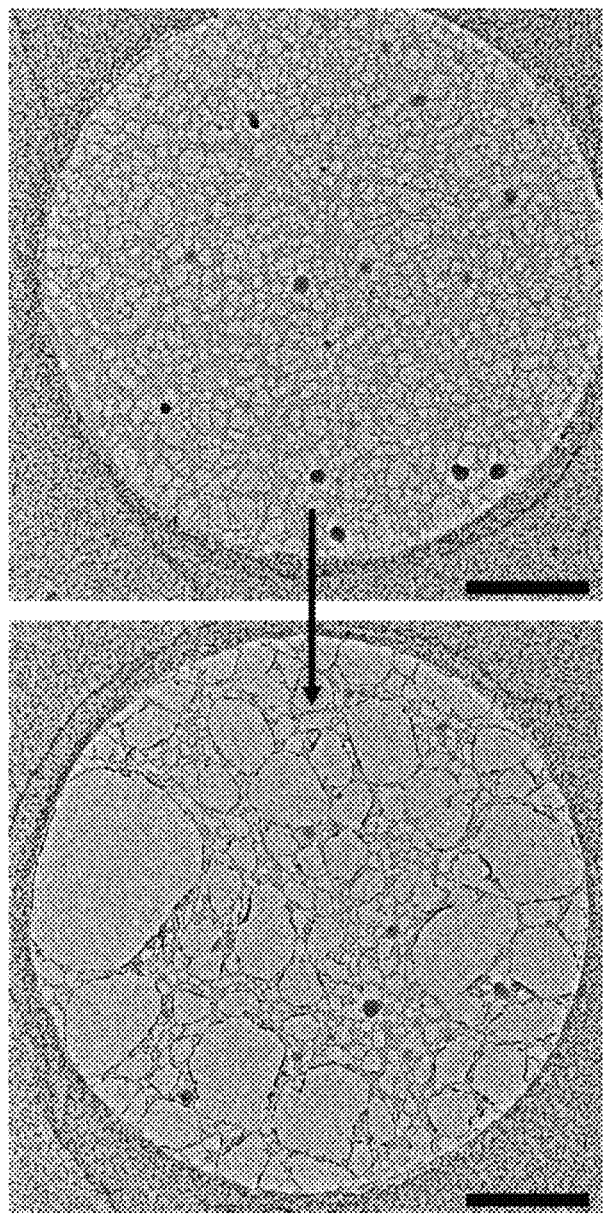

FIG. 5 Converting SPHyNs with small holes to SPHyNs with a larger average hole size. (top) TEM image of a SPHyN crosslinked with 10 mM Ms2TEG. (below) The same membrane after 45 s plasma treatment. Scale bars are 500 nm.

Figure 6:
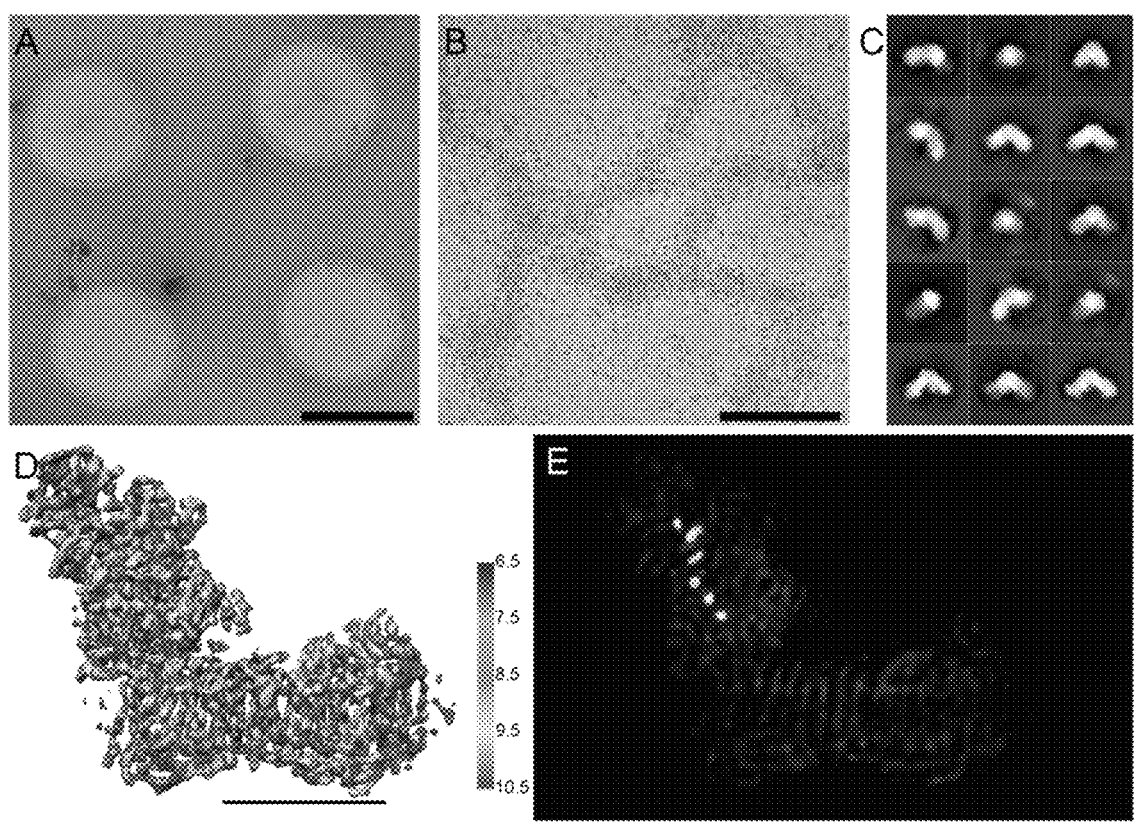

FIG. 6 Cryo-EM of complex I from *Y. lipolytica* vitrified on SPHyNs. (A) Cryo-EM image of a vitrified sample revealing the SPHyN spanning the holes of a Quantifoil® R2/2 substrate. High-resolution cryo-EM image showing vitrified complex I and the SPHyN. (C) 2D class averages. (D) Electron density of complex I at 8.1 Å resolution using the local resolution result for coloring. The color scale is given in AÅ. (E) Representation of the electron density map of complex I revealing the iron-sulfur clusters in the soluble part of the protein. Scale bars: 2 μm (A), 200 nm (B), 10 nm (D).

Figure 7:
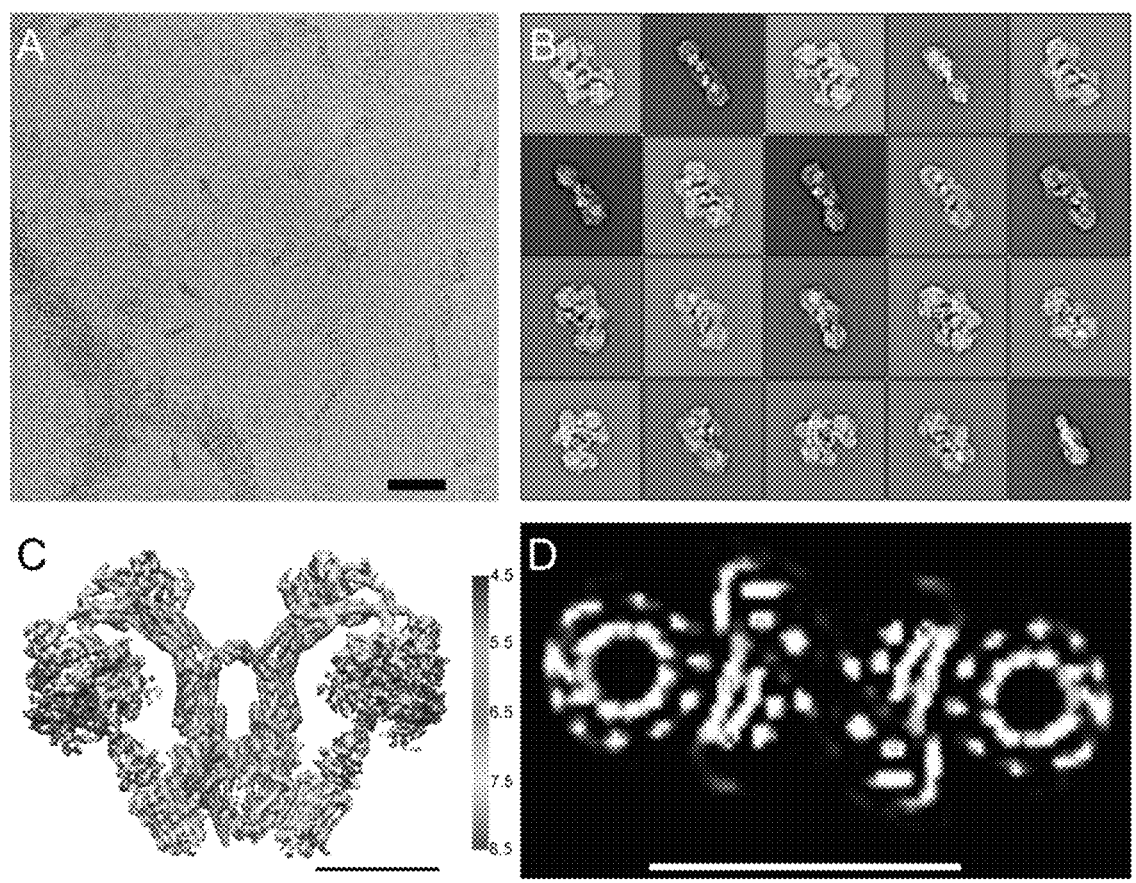

FIG. 7 Cryo-EM of ATP synthase from *Polytomella* sp. vitrified on SPHyNs. (A) Cryo-EM image of vitrified *Polytomella* ATP synthase dimers and the SPHyN. (B) 2D class averages. (C) Structure of the ATP synthase dimer at a resolution of 6.4 Å using the local resolution result for coloring. The color scale is given in Å. (D) Horizontal section through the Fo part revealing the cm rotor rings, 6 membrane-spanning α-helices per protomer and the hairpin of long horizontal a-subunit helices. Scale bars: 50 nm (A), 10 nm (C, D).

Figure 8:
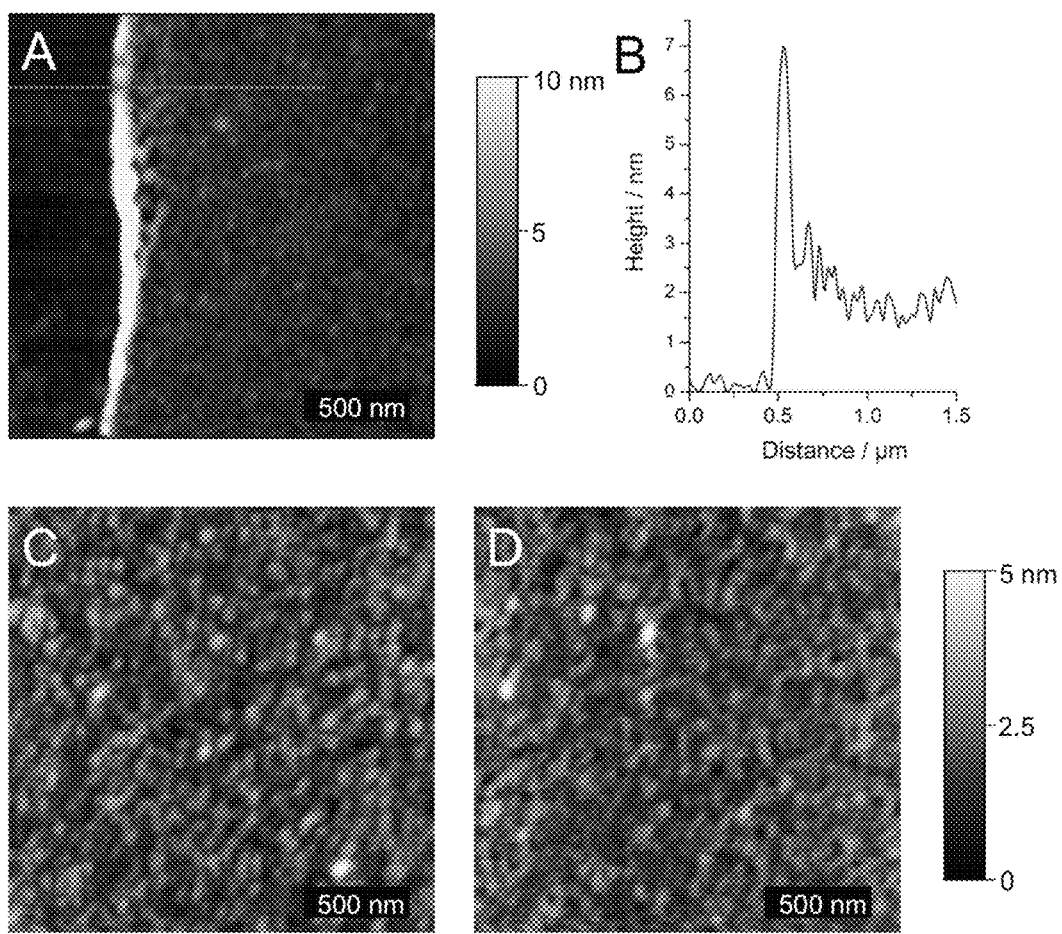

FIG. 8 AFM images of SPHyNs transferred to Si wafers.

Figure 9:
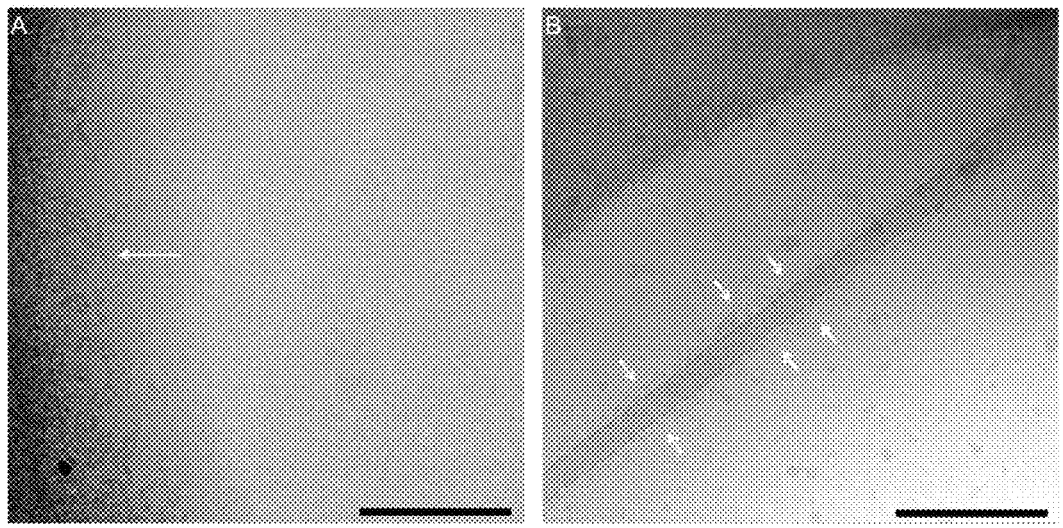

FIG. 9 Cryo-EM images of complex I vitrified on lacey carbon and continuous carbon film mounted on Quantifoil® R2/2 grids.

Figure 10:
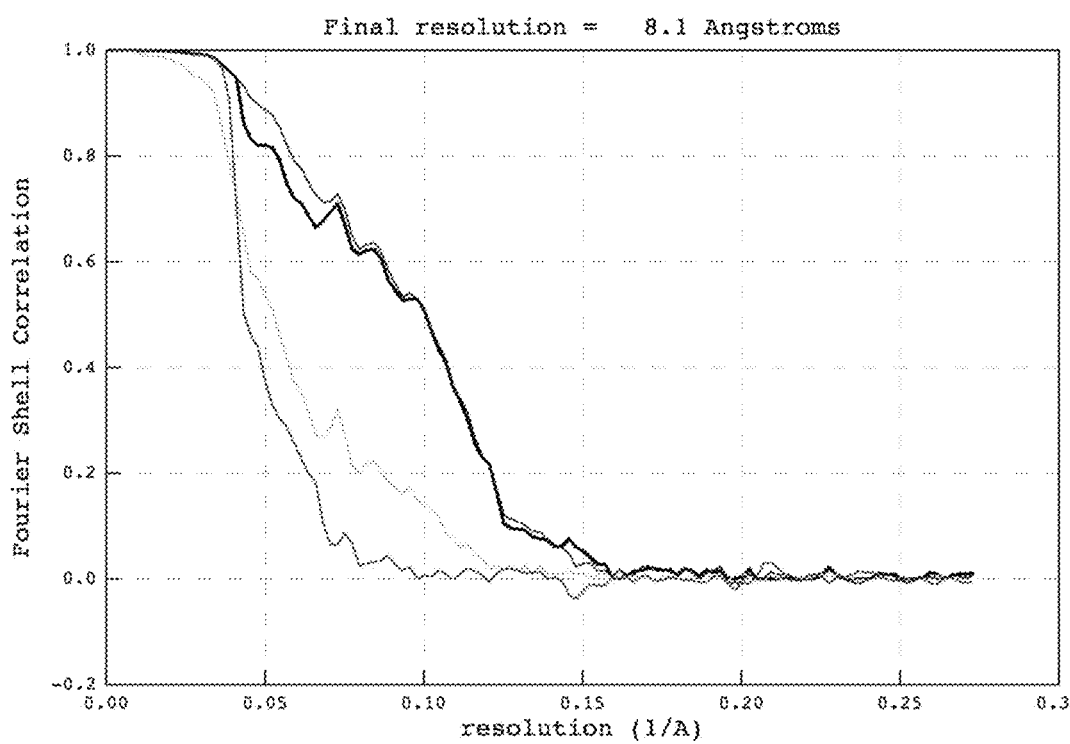

FIG. 10 FSC plot obtained during refinement of complex I structure.

Figure 11:
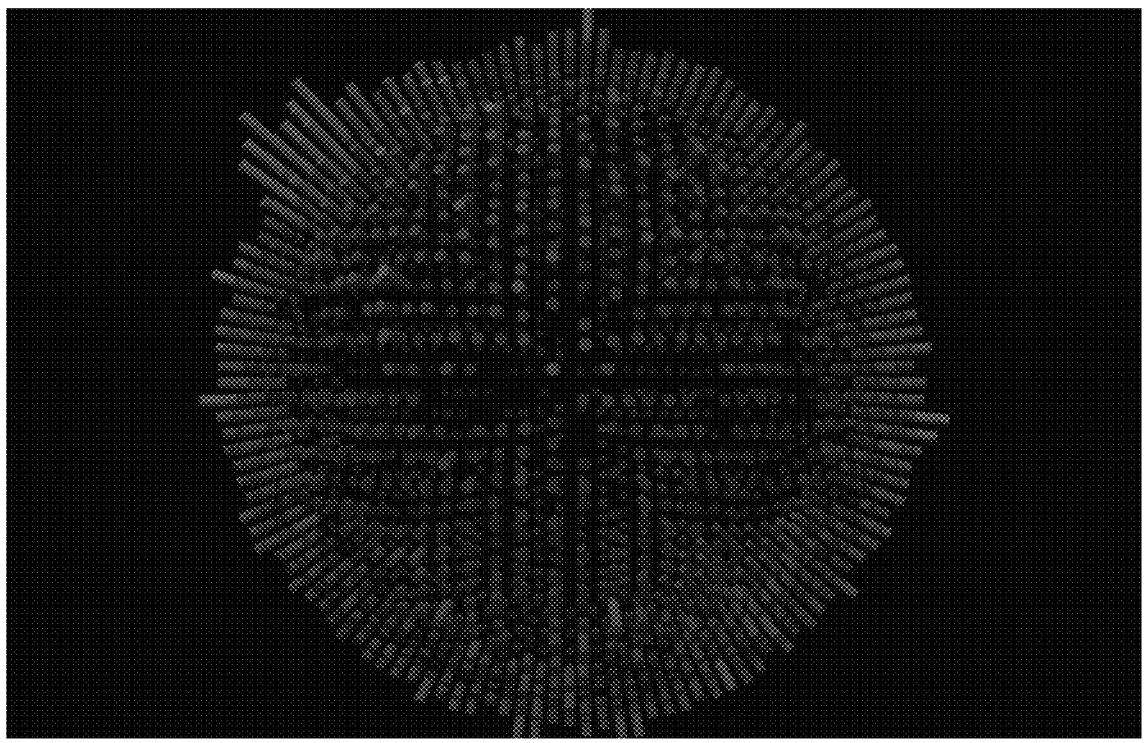

FIG. 11 Angular distribution plot for reconstruction of complex I 3D structure.

Figure 12:
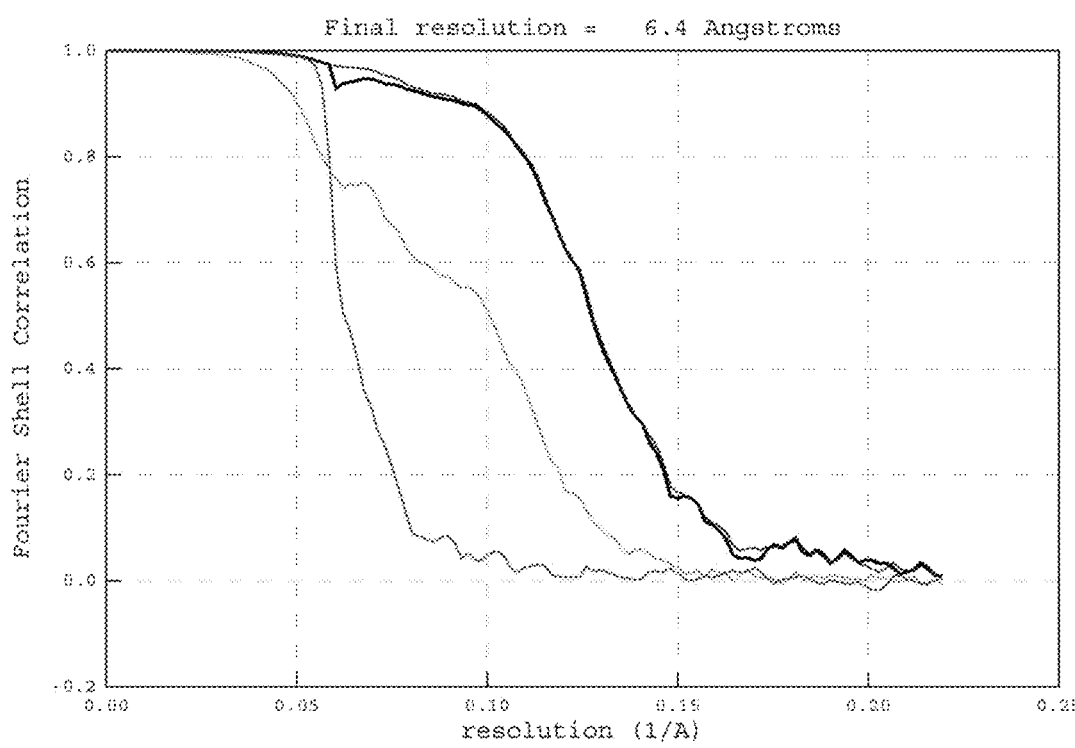

FIG. 12 FSC plot obtained during refinement of ATP synthase structure.

Figure 13:
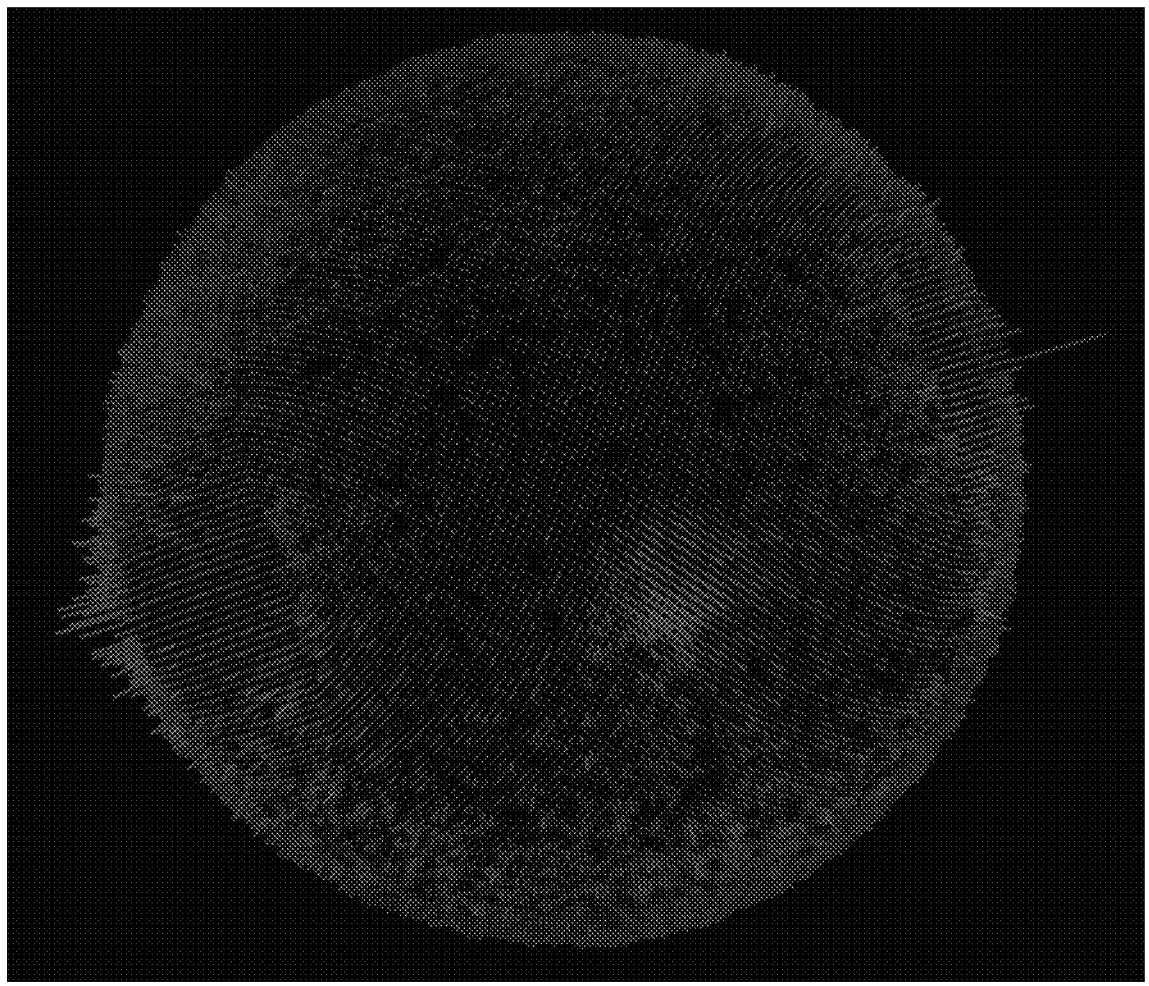

FIG. 13 Angular distribution plot for reconstruction of ATP synthase 3D structure.

Figure 14:
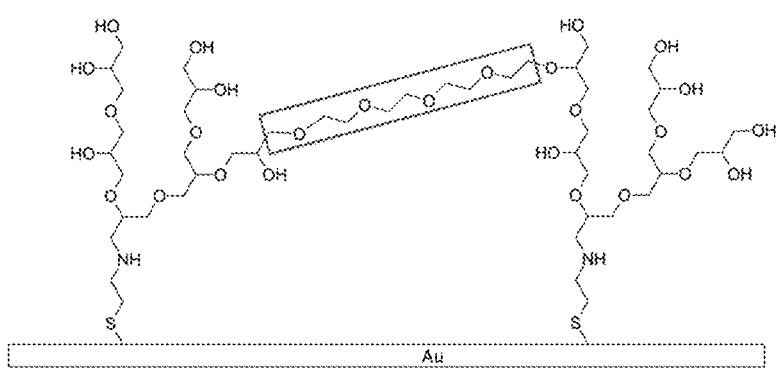

FIG. 14 Bifunctional cross-linking of two polyglycerol dendrimers using a tetraethylene glycol derivative.

Figure 15:
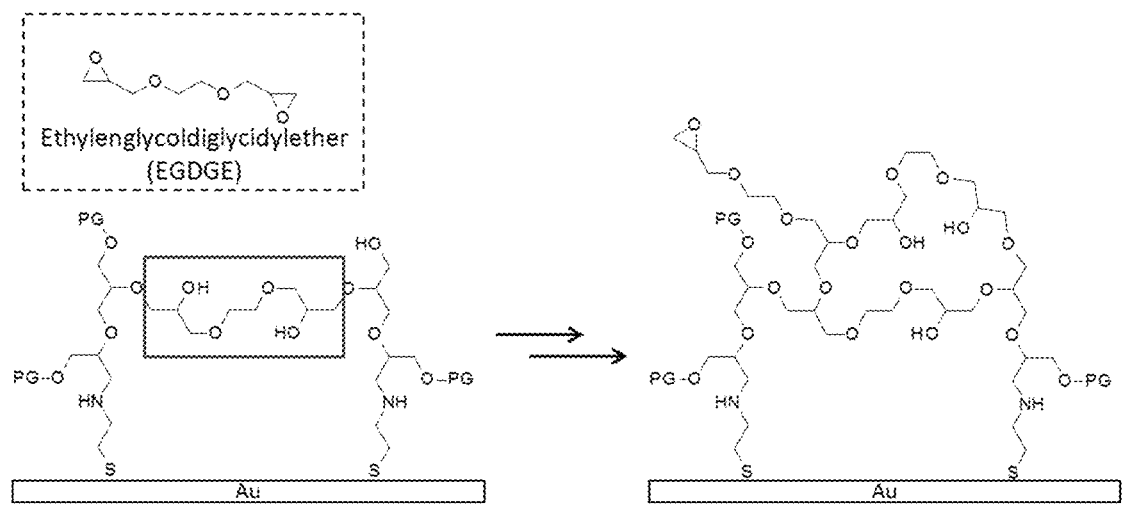

FIG. 15 Polymerization cross-linking of two polyglycerol dendrimer molecules using ethylene glycol diglycidyl ether (EGDGE). After cross-linking two new hydroxyl groups are formed allowing a further polymerization with EGDGE (right hand).

Figure 16:
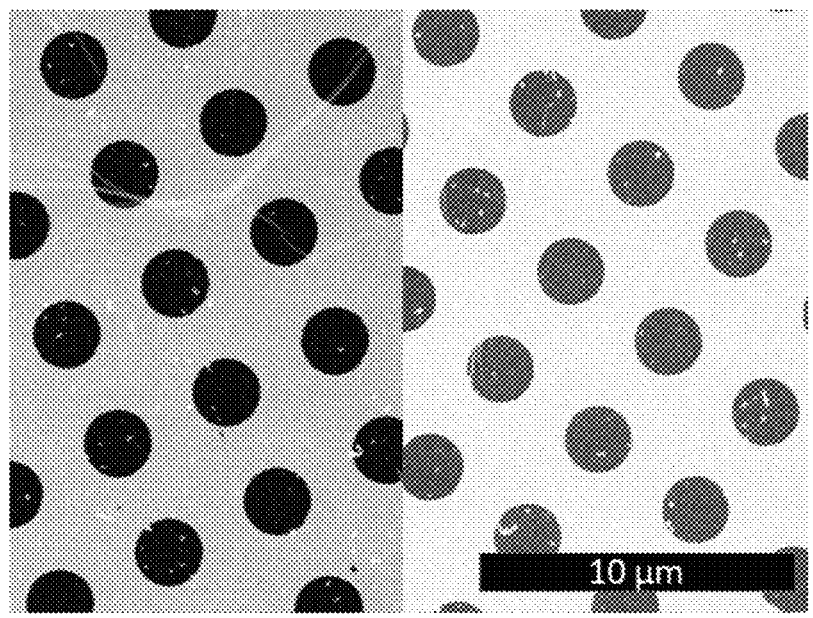

FIG. 16 Scanning tunnel microscopic image of a continuous PG-EGDGE membrane.

To stabilize the thin water layer for the cryo-EM, the invention devises a method for the fabrication of SPHyNs with a thickness of ~2 nm by chemical crosslinking of monolayers of, for example, polyglycerol (PG), a biorepulsive hydrophilic dendrimer that exposes a multitude of OH groups.[13-17]

The fabrication of SPHyNs and their transfer to TEM grids is shown schematically in FIG. 2.

Next, the concentrations of the crosslinker Ms2TEG from 3 mM-100 mM to optimize the properties of the PG layers. The thickness of the layers did not increase significantly upon crosslinking at any concentration used. When transferred to silicon wafers, the films formed continuous membranes with a thickness of ~2 nm (Supporting FIG. S1). In contrast, upon transfer to holey carbon substrates (FIG. 2d) in a critical-point dryer, the freestanding crosslinked PG film formed perforated membranes at any concentration of Ms2TEG. FIG. 3 shows TEM images of SPHyNs revealing a spider web-like structure with 50-500 nm holes.

We observed an almost linear dependence of porosity of freestanding SPHyNs on the crosslinker for Ms2TEG concentrations between 100 mM and 20 mM (FIG. 3C). At Ms2TEG concentrations below 20 mM, the porosity was difficult to control. We conclude that two factors determine the structure of freestanding SPHyNs: the concentration of the crosslinker as well as forces imparted to the membranes during the transfer process. Upon crosslinking, weak points in the PG membranes act as nucleation points for subsequent self-perforation of the freestanding membranes upon removal of the sacrificial PMMA layer.

To analyze the influence of hole size and shape on the self-perforation of the crosslinked PG membranes, we transferred membranes to C-flat® multi-hole grids with a variety of round and elliptical holes. TEM images of such SPHyNs are shown in FIG. 4A. The images demonstrate that the structure of freestanding SPHyNs, formed upon transfer to holey substrates, is independent of shape and size of the holes supporting the mechanism suggested above. FIG. 4B shows an SEM image of a crosslinked PG membrane transferred to a Quantifoil® R2/2 substrate. Neither SEM nor TEM indicated pore formation in the crosslinked PG films covering the solid substrate areas. This confirms the AFM results (Supporting FIG. S1), which show that the crosslinked PG membranes form continuous, films on solid supports.

Mild plasma treatment increased the average pore size of SPHyNs. The top of FIG. 5 shows a TEM image of a SPHyN crosslinked with 10 mM Ms2TEG. Upon glow-discharge for 45 s, the average covered area decreased from 39 (+/−3) % to 10 (+/−3) %. (FIG. 5, bottom).

To demonstrate that SPHyNs improve the distribution of detergent-solubilized membrane proteins in the thin water films used for cryo-EM, we prepared vitreous samples of complex I and ATP synthase dimers, two eukaryotic membrane protein complexes, for which it has been difficult to obtain cryo-specimens with the large number of particles per unit area required for high-resolution data collection.[18,19] Mitochondrial complex I is a multi-subunit complex involved in electron transfer from NADH to ubiquinone to transfer protons across the inner mitochondrial membrane.[20] Obtaining vitrified samples of complex I from *Y. lipolytica* with a homogeneous distribution of particles in the holes of a holey carbon film is a bottleneck for structural analysis. Cryo-EM images of complex I from *Y. lipolytica* vitrified on Quantifoil® R2/2 substrates as well as on lacey carbon films mounted on Quantifoil® R2/2 substrates reveal particles aggregated on the carbon surface, although in both cases the carbon was made hydrophilic by glow discharge (Supporting FIG. S2). The reduced surface tension caused by the detergent dodecyl maltoside (DDM), used to solubilize complex I, depleted particles are from the water film, creating a bottleneck for single particle analysis.

FIG. 1B is a schematic sketch of a protein sample vitrified on SPHyNs. Cryo-EM images of complex I vitrified on SPHyNs routinely revealed more than 60 individual protein particles per image suitable for single particle cryo-EM (FIG. 6A, B). Because the film is biorepulsive, adsorption of protein molecules to SPHyNs is minimized. In contrast, protein aggregation on the carbon surface precluded particle picking from Quantifoil® R2/2 grids (Supporting FIG. S2). Using 7138 particles from 123 images, we performed a gold-standard refinement and calculated a map of complex I with a resolution of 8.1 Å (Fourier shell correlation (FSC) criterion21=0.143) (FIG. 6D, E, Supporting FIG. S3). The map shows all elements of secondary structure known from previous work[18] and well-resolved iron-sulfur clusters (FIG. 6E).

To demonstrate that the method is broadly applicable in cryo-EM of membrane proteins, we prepared vitrified samples of mitochondrial ATP synthase from *Polytomella* sp. on SPHyNs. Although the structure of *Polytomella* ATP synthase dimers has been analyzed by cryo-EM with a resolution of 6.2 Å in former work,[19] obtaining vitrified samples of this F-type ATP synthase suitable for high-resolution structure determination remains difficult, as in the case of complex I. FIG. 7A demonstrates that SPHyNs prevent the depletion of ATP synthase dimers from the holes of Quantifoil® R2/2 substrates, allowing efficient acquisition of cryo-EM images.

We used 23200 particles from 2096 images to calculate a 3D reconstruction of dimeric *Polytomella* ATP synthase with a resolution of 6.4 Å (FIG. 7C, D, Supporting FIG. S4). Compared to previous work, in which 37238 dimer images were averaged to obtain a map with a resolution of 6.2 Å,[19] we required 14000 fewer particles (38% less) to calculate a 3D reconstruction with a resolution of 6.4 Å. This is explained by the fact that ATP synthase dimer samples vitrified on SPHyNs were be picked from areas where the amorphous ice layer was thin, whereas in former work particles were preferentially located in areas in the corners of the grid square, where the ice is thicker.[19]

Apart from stabilizing the thin film of aqueous buffer spanning the holes, crosslinked PG-membranes form a continuous biorepulsive layer on the carbon support. We assume that adsorption of proteins to the solid substrate areas is minimized, which contributes to the improved distribution of protein molecules in the holes, as observed in this work and previous work on gold substrates functionalized with self-assembled monolayers.[12] An important advantage of our approach is the fact that SPHyNs can be transferred to substrates other than amorphous carbon, such as gold[10] or titanium-silicon films.[5]

In summary, we have demonstrated that SPHyNs improve the distribution of proteins in the thin water film in specimen preparation for cryo-EM thus facilitating the acquisition of large high-quality single-particle image data sets. The advantages of SPHyNs are threefold. First, owing to the hydrophilic nature of the hydrogel, aqueous samples can be applied to the grid without prior glow discharge. This prevents protein adsorption to the reverse side of the film, in contrast to glow-discharged conventional carbon film. Second, the network stabilizes the thin water film, and thus suppresses the formation of a meniscus and the concomitant depletion of proteins from the holes. Third, SPHyNs are protein-repellent, which minimizes the interaction between the support film and the membrane proteins. All three effects assure a homogeneous distribution of the protein molecules in the thin layer of vitrified buffer. This opens the opportunity for using SPHyNs on holey carbon supports with round holes for automated data collection.[22] SPHyNs hold great promise to obtaining high-quality vitrified membrane protein samples with an abundance of protein molecules conveniently located in thin ice areas.

Experimental Part

Materials and Methods

SAM Formation and Characterization

Gold substrates for SAM deposition were prepared by electron beam evaporation. 2.5 nm of titanium followed by 200 nm of gold were deposited onto polished single-crystal silicon wafers with (100) orientation (Wacker Siltronic AG, Germany). For the preparation of the PG nanomembranes, 200 nm of gold were deposited onto polished single-crystal silicon wafers with (100) orientation without an adhesion-layer.

Ethanol (99% with 1% petroleum ether) was refluxed for 6 h and freshly distilled before use. The gold substrates were cleaved from the wafer, rinsed with ethanol and cleaned with $H_2$ plasma in a Harrick PDC-32G plasma cleaner (high level, pressure of 5.10-1 mbar, 2 min). For SAM deposition, the clean substrates were immersed in 5 μM solutions of disulfide PG in ethanol at room temperature. After at least 48 hours, the samples were rinsed with water, ethanol and dried in a nitrogen stream.

Crosslinking of PG SAMs

Crosslinking of the PG monolayer was performed by the immersion of the substrate in a solution consisting of Ms2TEG[23] at the desired concentration and 1.2 eq of pyridine in N,N-dimethylformamide under argon. The substrates were incubated for 24 h at room temperature, washed with water and ethanol and dried in a stream of nitrogen.

Transfer of Crosslinked PG Membranes

For the transfer of PG nanomembranes to TEM grids or single-crystal silicon wafers cross-linked PG monolayers were prepared on 200 nm of gold deposited onto polished single-crystal silicon wafers without any adhesion layer. First, the crosslinked PG film was protected by spin-coating poly(methylmethacrylate) (PMMA) on the film. Afterwards the gold was exfoliated by angular dipping of the substrate into water. The floating gold film was transferred to the different solutions with a piece of silicon. The gold was etched by placing the floating gold film on an iodine solution (2.5 wt % iodine, 10 wt % potassium iodide in water). Afterwards the PMMA-protected membrane was placed on an aqueous potassium iodide solution (10 wt % potassium iodide in water). In the case of freestanding membranes, the PMMA was removed by immersion in acetone for 2 h, followed by critical-point-drying. On silicon wafers the PMMA was removed by immersion in acetone for 2 h and drying in a stream of nitrogen.

Analysis of PG Membranes by SEM and TEM

SEM analysis of SPHyNs was performed with a Zeiss Auriga operating at an accelerating voltage of 5 kV. SPHyNs were analyzed at room temperature in a FEI Tecnai Spirit transmission electron microscope operating at an accelerating voltage of 120 kV. Images were acquired using a Gatan 4k*4k CCD camera. Images were analyzed using ImageJ.[24]

Cryo-EM and 3D reconstruction of complex I from *Y. lipolytica*

Complex I was purified as described previously.[25] 3 μl of a complex I sample at a concentration of approximately 2 mg/ml was applied to Quantifoil® R2/2 holey carbon grids coated with SPHyN without glow discharge. The grids were blotted for 9 sec at 70% humidity and 16° C. in an FEI Vitrobot plunge-freezer. CryoEM images were recorded on a FEI Tecnai Polara operating at 300 kV equipped with a Gatan K2 back-thinned direct detector operating in movie mode. Images were collected manually at a nominal magnification of 115,000×, corresponding to a sampling density of 1.83 Å/pixel. Videos were collected for 8 s with a total of 40 frames with a calibrated dose of about 0.5 e-/Å$^2$ per frame, at defocus values between −1.1 and −3.9 µm. A set of 154 micrographs was collected and the frames were aligned by the algorithm of by Li et al.[3] Particles were picked using the semi-automatic procedure of EMAN Boxer,[26] and the micrograph-based CTF was determined with CTFFIND3[27] in the RELION workflow.[28] The initial dataset contained a total of 7,630 particle images from 123 selected micrographs and were extracted using a box of 240 pixels. The particles were subjected to an initial two-dimensional reference-free (2D) classification in RELION to discard imperfect particles. Visual selection of particle classes with interpretable features resulted in a dataset of 7138 particle images for 3D consensus refinement. A map based on the cryo-EM map of *Y. lipolytica* complex I[18] was low-pass filtered to 50 Å and used as an initial model for the 3D gold standard refinement in RELION. The post-processing procedure implemented in RELION was applied to the final maps for B-factor sharpening and resolution validation.[29] The local resolution of the map was estimated by ResMap.[30] The complex I crystal structure (pdb code 4WZ7) was rigid-body fitted and figures were drawn in Chimera.[31]

Cryo-EM and 3D reconstruction of *Polytomella* ATP synthase dimers

Mitochondria were isolated from *Polytomella* sp. cells (198.80, E. G. Pringsheim) as described previously.[32] A 3 µl sample with a concentration of 1.5 mg/ml was applied to Quantifoil® R2/2 grids coated with SPHyNs without glow discharge treatment. Samples were blotted in an FEI Vitrobot Mark IV at 4° C. and 100% humidity for 10 s and plunged into liquid ethane. Data acquisition was carried out on a JEM-3200 FSC equipped with an in-column energy filter and K2 Summit detector operated in counting mode. Micrographs were collected as 9 s movies of 0.2 s/frame with a dose rate of 11 e-/pix/s and a pixel size of 1.14 Å. Motion between frames was corrected by running Unblur[33,34] without dose filtering, followed by MotionCor2, with dose-filtering.[35] CTF estimation was carried out using CTFFind4[36] within the RELION workflow, and was carried out on non-dose-filtered movie frames, summing 1, 2 or 4 frames. For each micrograph, defocus values from the run giving the best 'Resolution to which Thon rings are fit' value were used. Micrographs for which this resolution was 7 Å or worse were discarded. All subsequent processing steps were carried out in Relion[2] beta version.28,37 The summed images were used to extract hand-picked particles at a box size of 480 pixels, which were down-sampled to a box size of 240. 3D refinement was carried out against a 40 Å-low-pass-filtered starting model based on previous work19 using C2 symmetry and a soft mask including the entire dimeric protein. Local resolution estimation was carried out using ResMap29 within the Relion 2.0beta workflow. Figures were generated in Chimera.[31]

REFERENCES

[1] McMullan, G.; Chen, S.; Henderson, R.; Faruqi, A. R. Detective Quantum Efficiency of Electron Area Detectors in Electron Microscopy. Ultramicroscopy 2009, 109, 1126-1143.

[2] Milazzo, A.-C.; Cheng, A.; Moeller, A.; Lyumkis, D.; Jacovetty, E.; Polukas, J.; Ellisman, M. H.; Xuong, Nguyen-Huu; Carragher, B.; Potter, C. S. Initial Evaluation of a Direct Detection Device Detector for Single Particle Cryo-Electron Microscopy. J. Struct. Biol. 2011, 176, 404-408.

[3] Li, X.; Mooney, P.; Zheng, S.; Booth, C. R.; Braunfeld, M. B.; Gubbens, S.; Agard, D. A.; Cheng, Y. Electron Counting and Beam-Induced Motion Correction Enable Near-Atomic Resolution Single-Particle Cryo-E M. Nat. Methods 2013, 10, 584-590.

[4] Kühlbrandt, W. The Resolution Revolution. Science 2014, 343, 1443-1444.

[5] Rhinow, D.; Kiihlbrandt, W. Electron Cryo-Microscopy of Biological Specimens on Conductive Titanium-Silicon Metal Glass. Ultramicroscopy 2008, 108, 798-705.

[6] Pantelic, R. S.; Suk, J. W.; Magnuson, C. W; Meyer, J. C.; Wachsmuth, P.; Kaiser, U.; Ruoff, R. S.; Stahlberg, H. Graphene: Substrate Preparation and Introduction. J. Struct Biol. 2011, 174, 234-238.

[7] Russo, C. J.; Passmore, L. A. Controlling Protein Adsorption on Graphene for Cryo-EM Using Low-Energy Hydrogen Plasmas. Nat. Methods 2014, 11, 649-652.

[8] Rhinow, D. et al. Ultrathin Conductive Carbon Nanomembranes as Support Films for Structural Analysis of Biological Specimens. Phys. Chem. Chem. Phys. 2010, 12, 4345-4350.

[9] Pantelic, R. S. et al. Meyer, J. C.; Kaiser, U.; Baumeister, W.; Plitzko, J. M. J. Struct. Biol. Graphene oxide: A Substrate for Optimizing Preparations of Frozen-Hydrated Samples. 2010, 170, 152-156.

[10] Russo, C. J. et al. Ultrastable Gold Substrate for Electron Cryo-Microscopy Science 2014, 346, 1377-1379.

[11] Cheung, M.; Kajimura, N.; Makino, F.; Ashihara, M.; Miyata, T.; Kato, T.; Namba, K.; Blocker, A. J. A Method to Achieve Homogeneous Dispersion of Large Transmembrane Complexes Within the Holes of Carbon Films for Electron Microscopy. J. Struct Biol. 2013, 182, 51-56.

[12] Meyerson, J. R.; Rao, P; Kumar, J.; Chittori, S.; Banerjee, S.; Pierson, J.; Mayer, M. L.; Subramaniam, S. Self-Assembled Monolayer Improve Protein Distribution on Holey Carbon Cryo-EM Supports. Sci. Rep. 2014, 4:7084.

[13] Khan, M.; Huck, W. T. Hyperbranched Polyglycidol on Si/SiO2 Surfaces via Surface-Initiated Polymerization. Macromolecules 2003, 36, 5088-5093.

[14] Siegers, C.; Biesalski, M.; Haag, R. Self-Assembled Monolayers of Dendritic Polyglycerol Derivatives on Gold That Resist the Adsorption of Proteins. Chem.—Eur. J. 2004, 10, 2831-2838.

[15] Kainthan, R. K.; Zou, Y.; Chiao, M.; Kizhakkedathu, J. N. Self-Assembled Monothiol-Terminated Hyperbranched Polyglycerols on a Gold Surface: A Comparative Study on the Structure, Morphology, and Protein Adsorption Characteristics with Linear Poly(ethylene Glycol)s. Langmuir 2008, 24, 4907-4916.

[16] Wyszogrodzka, M.; Haag, R. Synthesis and Characterization of Glycerol Dendrons, Self-Assembled Monolayers on Gold: A Detailed Study of Their Protein Resistance. Biomacromolecules 2009, 10, 1043-1054.

[17] Weber, T.; Bechthold, M.; Winkler, T.; Dauselt, J.; Terfort, Direct Grafting of Anti-Fouling Polyglycerol Layers to Steel and Other Technically Relevant Materials. A. Colloids Surf. B 2013, 111, 360.

[18] D'Imprima, E.; Mills, D. J.; Parey, K.; Brandt, U.; Kühlbrandt, W.; Zickermann, V.; Vonck, J. Cryo-EM Structure of Respiratory Complex I Reveals a Link to Mitochondrial Sulfur Metabolism. Biochim. Biophys. Acta 2016, 1857, 1935-1942.

[19] Allegretti, M.; Klusch, N.; Mills, D. J.; Vonck, J.; Kühlbrandt, W.; Davies, K. M. Horizontal Membrane-Instrinsic □□-Helices in the Stator a-Subunit of an F-type ATP Synthase. Nature 2015, 521, 237-240.

[20] Hirst, J. Mitochondrial Complex I. Annu. Rev. Biochem. 2013, 82, 551-575.

[21] Scheres, S. H.; Chen, S. Preventing Overfitting in Cryo-EM Structure Determination Nat. Methods 2012, 9, 853-854.

[22] Suloway, C.; Pulokas, J.; Fellmann, D.; Cheng, A.; Guerra, F.; Quispe, J.; Stagg, S.; Potter, C. S.; Carragher, B. Automated Molecular Microscopy: The New Leginon System. J. Struct. Biol. 2005, 151, 41-60.

[23] Perepichka, I. F.; Besbes, M.; Levillain, E.; Salle, M.; Roncali, J. Hydro-philic Oligo(oxyethylene)-Derivatized Poly(3,4-ethylenedioxythiophenes): Cation-Responsive Optoelectroelectrochemical Properties and Solid-State Chromism", Chem. Mat. 2002, 14, 449-457.

[24] Rasband, W. S. ImageJ, U. S. National Institutes of Health, Bethesada, Md., USA, https://imagej.nih.gov./ij/, 1997-2016.

[25] Kashani-Poor, N.; Kerscher, S.; Zickermann, V.; Brandt, U. Efficient Large-scale Purification of His-Tagged Protein Translocating NADH: Ubiquinone Oxidoreductase (Complex I) from the Strictly Aerobic Yeast Yarrowia lipolytica. Biochim. Biophys. Acta 2001, 1504, 363-370.

[26] Ludtke, S. J.; Baldwin, P. R.; Chiu, W. EMAN: Semiautomated Software for High-Resolution Single-Particle Reconstructions. J. Struct. Biol. 1999, 128, 82-97.

[27] Mindell, J. A.; Grigorieff, N. Accurate Determination of Local Defocus and Specimen Tilt in Electron Microscopy. J. Struct. Biol. 2003, 142, 334-347.

[28] Scheres, S. H. W. J. RELION: Implementation of a Bayesian Approach to Cryo-EM Structure Determination. J. Struct. Biol. 2012, 180, 519-530.

[29] Chen, S.; McMullan, G.; Faruqui, A. R.; Murshudov, G. N.; Short, J. M.; Scheres, S. H. W.; Henderson, R. High-Resolution Noise Substitution to Measure Overfitting and Validate Resolution in 3D Structure Determination by Single Particle Electron Cryomicroscopy. Ultramicroscopy 2013, 135, 24-35.

[30] Kuckelbir, A.; Sigworth, F. J.; Tagare, H. D. Quantifying the Local Resolution of Cryo-EM Density Maps. Nat. Methods 2014, 11, 63-65.

[31] Pettersen, E. F.; Goddard, T. D.; Huang, C. C.; Couch, G. S.; Greenblatt, D. M.; Meng, E. C.; Ferrin, T. E. UCSF Chimera—a Visualization System for Exploratory Research and Analysis. J. Comput. Chem. 2004, 25, 1605-1612.

[32] van Lis, R.; Mendoza-Hernández, G.; Groth, G.; Atteia, A. New Insights into the Unique Structure of the FoF1-ATP Synthase from the Chlamydomonad Algae *Polytomella* sp. and *Chlamydomonas reinhardtii*. Plant Physiol. 2007, 144, 1190-1199.

[33] Brilot, A. F.; Chen, J. Z.; Cheng, A.; Pan, J.; Harrison, S. C.; Potter, C. S.; Carragher, B.; Henderson, R.; Grigorieff, N. Beam-Induced Motion of Vitrified Specimen on Holey Carbon Film. J. Struct. Biol. 2012, 177, 630-637.

[34] Campbell, M. G.; Cheng, A.; Brilot, A. F.; Moeller, A.; Lyumkis, D.; Pan, J.; Harrison, S. C.; Potter, C. S.; Carragher, B.; Grigorieff, N. Movies of Ice-Embedded Particles Enhance Resolution in Electron Cryo-Microscopy. Structure 2012, 20, 1823-1828.

[35] Zheng, S. Q.; Palovcak, E.; Armache, J.-P.; Verba, K. A.; Cheng, Y.; Agard, D. A. MotionCor2: Anisotropic Correction of Beam-Induced Motion for Improved Cryo-Electron Microscopy. Nat. Methods 2017, published online.

[36] Rohou A.; Grigorieff, N. CTFFIND4: Fast and Accurate Defocus Estimation from Electron Micrographs. J. Struct. Biol. 2015, 192, 216-221.

[37] Scheres, S. H. W. A Bayesian View on Cryo-EM Structure Determination. J. Struct. Biol. 2012, 180, 406-418.

Synthesis of SAM-Forming Molecules

General Methods

Moisture- or oxygen-sensitive reactions were performed under nitrogen 5.0 (≥99.999 vol. %) in glassware dried by heating under vacuum. 1H-NMR spectra were recorded with a Bruker AM-250 and AV-500 instrument. Chemical shifts in ppm were measured relative to tetramethylsilane. Spectra were calibrated using residual solvent signals either of chloroform ($\delta$=7.26 ppm) or dimethylsulfoxide ($\delta$=2.50 ppm) as a reference.

Synthesis of Disulfide-PG

Cystamine (640 mg, 4.20 mmol, 1 eq) was heated to 95° C. and glycidol (31.1 g, 420 mmol, 100 eq) was slowly added by a syringe pump (0.5 ml/h, 56 h) under continued heating and stirring. The reaction mixture was allowed to cool to room temperature followed by the addition of 50 ml of water. The resulting solution was dialyzed against 10 l of water for 4 days. The water was exchanged once per day. The solvent was removed under reduced pressure and the residue dried in an oil pump vacuum.

yield: 6.45 g

Mm=2236 Da

1H-NMR (500.2 MHz, DMSO-D6): $\delta$=4.74 (s, br), 4.67 (s, br), 4.60 (s, br), 4.53 (s, br), 4.47 (s, br), 3.70 (s, br), 3.54 (s, br), 3.40 (s, br), 3.35 (s, br), 3.32 (s, br). 13C-NMR (125.8 MHz, DMSO-D6): $\delta$=80.1 (s, br), 79.9 (s, br), 79.8 (s, br), 78.2 (s, br), 77.9 (s, br), 72.9 (s, br), 71.7 (s, br), 71.5 (s, br), 70.8 (s, br), 70.7 (s, br), 70.5 (s, br), 69.5 (s, br), 68.9 (s, br), 68.6 (s, br), 63.1 (s, br), 61.0 (s, br).

Atomic Force Microscopy (AFM)

AFM images were taken in "semicontact mode" at an NT-MDT (Solver Pro) instrument.

Infrared reflection absorption spectroscopy (IRRAS)

IRRA-spectra were measured on a Thermo Scientific Nicolet 6700 FT-IR spectrometer purged with dry air and equipped with a nitrogen-cooled mercury-cadmium-telluride-detector and a Smart SAGA set-up. Measurements were performed using p-polarized light at an incidence angle of 80° relative to the surface normal. 256 scans were recorded at a resolution of 4 $cm^{-1}$ from 650 to 3500 $cm^{-1}$ at room temperature.

Ellipsometry

Ellipsometric measurements were carried out on a Sentech SE400 ellipsometer with a He—Ne laser (632.8 nm) at an incidence angle of 70° from the surface normal. A multilayer model on the basis of the Sentech analysis software was used to calculate the layer thickness. The complex refractive index was determined individually on different positions immediately after H2 plasma cleaning. For the SAM layers, n=1.45 and k=0.00 were used as input in the multilayer simulations.

The features disclosed in the foregoing description, the claims and the accompanying drawings may, both separately and in any combination, be material for realizing the invention in diverse forms thereof.

The invention claimed is:

1. Method for preparing a hydrogel nanomembrane comprising:
    a) formation of a non-cross-linked hydrogel nanofilm on a first substrate;

b) cross-linking the non-cross-linked hydrogel with a cross-linking agent to obtain a cross-linked hydrogel nanomembrane; and
c) transferring the cross-linked hydrogel nanomembrane to a second substrate, wherein the non-cross-linked nanofilm comprises a biorepulsive hydrophilic dendrimer.

2. Method according to claim 1, wherein the biorepulsive hydrophilic dendrimer comprises polyglycerol or derivatives thereof.

3. Method according to claim 1, wherein the thickness of the non-cross-linked hydrogel nanofilm is from 1 to 4 nm.

4. Method according to claim 1, wherein the cross-linking agent is a bifunctional cross-linking agent and/or a polymerization cross-linking agent.

5. Method according to claim 4, wherein the bifunctional cross-linking agent is a oligoethylene glycol derivative.

6. Method according to claim 4, wherein the polymerization cross-linking agent is a diglycidyl ether.

7. Method according to claim 1, wherein the concentration of the cross-linking agent is from 20 mM to 100 mM.

8. Method according to claim 1, wherein the second substrate has holes.

9. Method according to claim 1, wherein holes in the nanomembrane are adjusted by consecutive plasma or glow discharge treatment.

10. Method according to claim 1, wherein the second substrate is a TEM grid.

11. Method according to claim 1, wherein the second substrate comprises silicon, carbon, $SiO_2$, Au or a composite thereof.

12. Cross-linked hydrogel nanomembrane obtained by the method according to claim 1.

13. Cross-linked hydrogel nanomembrane according to claim 12, the nanomembrane having holes of a width of 50 to 500 nm.

14. TEM grid comprising the cross-linked hydrogel nanomembrane and the second substrate obtained by the method according to claim 1, wherein the cross-linked hydrogel nanomembrane is disposed on at least one surface of the second substrate.

15. Method according to claim 1, wherein the cross-linking agent is a bifunctional cross-linking agent and/or a polymerization cross-linking agent.

16. Method according to claim 2, wherein the cross-linking agent is a bifunctional cross-linking agent and/or a polymerization cross-linking agent.

17. Method according to claim 1, wherein the second substrate consists of silicon, carbon, $SiO_2$, Au or a composite thereof.

* * * * *